United States Patent
Kwack

(10) Patent No.: US 8,711,640 B2
(45) Date of Patent: Apr. 29, 2014

(54) SEMICONDUCTOR MEMORY APPARATUS

(75) Inventor: Seung Wook Kwack, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 205 days.

(21) Appl. No.: 13/219,622

(22) Filed: Aug. 27, 2011

(65) Prior Publication Data

US 2012/0213011 A1    Aug. 23, 2012

(30) Foreign Application Priority Data

Feb. 21, 2011 (KR) .................. 10-2011-0015177

(51) Int. Cl.
*G11C 7/10* (2006.01)

(52) U.S. Cl.
USPC .............. 365/189.05; 365/230.08; 365/185.12

(58) Field of Classification Search
USPC .............. 365/189.05, 230.08, 185.12
See application file for complete search history.

(56) References Cited

U.S. PATENT DOCUMENTS 6,252,804 B1 *  6/2001  Tomita ................. 365/189.05

FOREIGN PATENT DOCUMENTS

| KR | 10-2008-0109404 A | 12/2008 |
| KR | 1020090067803 A | 6/2009 |
| KR | 1020090086029 A | 8/2009 |

* cited by examiner

*Primary Examiner* — Jason Lappas
(74) *Attorney, Agent, or Firm* — William Park & Associates Patent Ltd.

(57) ABSTRACT

A semiconductor memory apparatus includes: a data output signal transmitter configured to receive a data signal and a data mask signal and transmit a data output signal through a global data line, the data output signal being outputted by determining whether the data signal is masked or not; and a write driver configured to receive the data output signal through the global data line and input the received data output signal to a local data line corresponding to the data output signal.

6 Claims, 3 Drawing Sheets

SEMICONDUCTOR MEMORY APPARATUS

CROSS-REFERENCES TO RELATED APPLICATION

The present application claims priority under 35 U.S.C.§119(a) to Korean application number 10-2011-0015177 filed on Feb. 21, 2011, in the Korean Intellectual Property Office, which is incorporated herein by reference in its entirety.

BACKGROUND

1. Technical Field

The present invention relates generally to a semiconductor memory apparatus, and more particularly, to data mask technology of a semiconductor memory apparatus.

2. Related Art

In general, a semiconductor memory apparatus provides a data mask function. Such a data mask function refers to a function of masking a signal transmitted to a write driver, when a data mask signal is activated, such that data of a global line is not inputted to a local line so as not to be written into a cell.

FIG. 1 is a block diagram illustrating a part of a write path of a known semiconductor memory apparatus.

Referring to FIG. 1, when a write command is activated, a data signal and a data mask signal are inputted to a data input unit 10 and a data mask input unit 20 of the known semiconductor memory apparatus, respectively.

The data signal inputted in such a manner is transmitted to a repeater 30 through a global data line GDL, and the data mask signal is transmitted to the repeater 30 through a global data mask line GDML.

The data signal and the data mask signal transmitted in such a manner are amplified by the repeater 30, and then inputted to a write driver 40 through the global data line GDL and the global data mask line GDML.

The write driver 40 is configured to receive the data signal and the data mask signal, and determine whether the data signal is masked or not. According to the determination result, the write driver 40 transmits a data signal, which is not masked, to a local line (not illustrated), or does not transmit a masked data signal to the local line.

As such, the known semiconductor memory apparatus transmits the data signal and the data mask signal, which are inputted to the data input unit 10 and the data mask input unit 20, respectively, to the write driver 40 through the global data line GDL and the global data mask line GDML, respectively.

However, since the known semiconductor memory apparatus includes the global data mask line GDML for transmitting the data mask signal, the size of the semiconductor memory apparatus may increase due to the area where the global data mask line GDML is formed, and thus the net die of the semiconductor memory apparatus may decrease.

SUMMARY

A semiconductor memory apparatus capable of reducing a global data mask line for transmitting a data mask signal is described herein.

In one embodiment of the present invention, a semiconductor memory apparatus comprising: a data output signal transmitter configured to receive a data signal and a data mask signal and transmit a data output signal through a global data line, wherein the data output signal is transmitted if the data signal is not masked; and a write driver configured to receive the data output signal through the global data line and input the received data output signal to a local data line.

In another embodiment of the present invention, a semiconductor memory apparatus comprising: a data input unit configured to receive a data signal and transmit the received data signal through a global data line; a data mask input unit configured to receive a data mask signal and transmit the received data mask signal through a global data mask line; a repeater configured to receive the data signal and the data mask signal through the global data line and the global data mask line, respectively, and transmit a data output signal through the global data line, wherein the data output signal is transmitted if the data signal is not masked; and a write driver configured to receive the data output signal transmitted from the repeater through the global data line and input the received signal to a local data line.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described below with reference to the accompanying drawings through exemplary embodiments.

Figure 1:
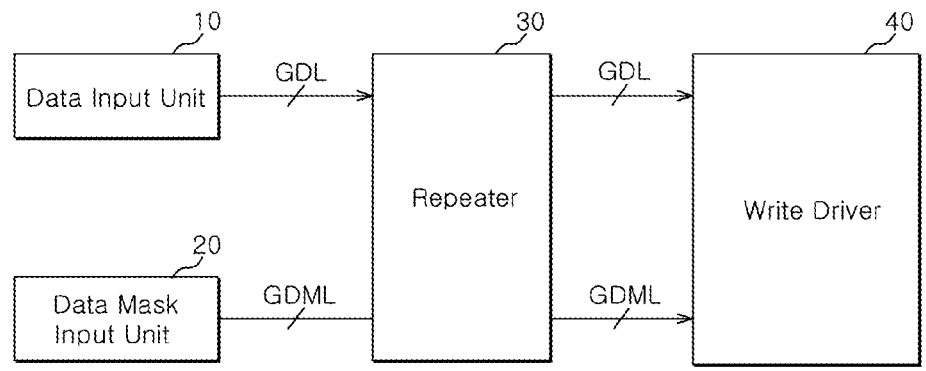
FIG. 1 is a block diagram illustrating a part of a write path of a known semiconductor memory apparatus.
Figure 2:
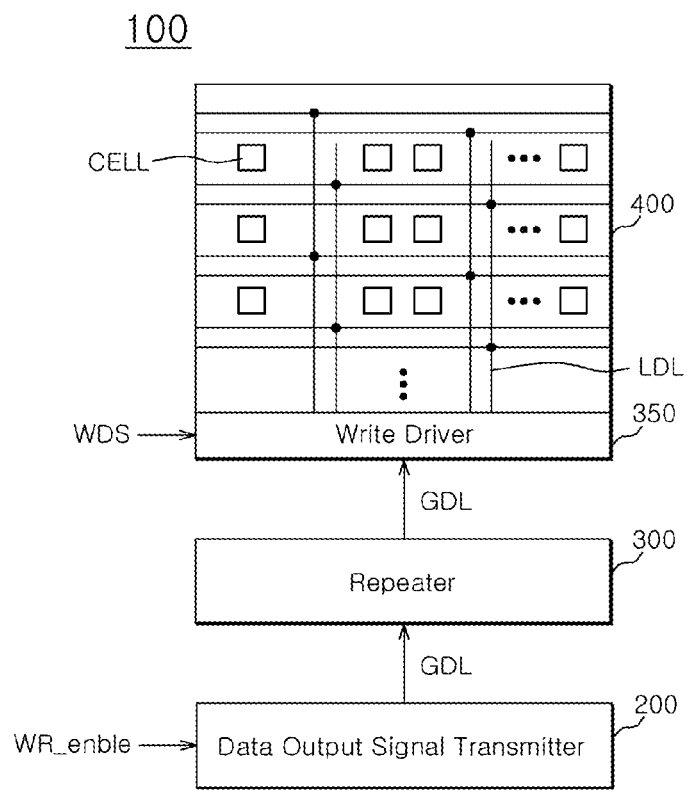
FIG. 2 is a block diagram illustrating a write path of a semiconductor memory apparatus according to one embodiment.

FIG. 2 is a block diagram illustrating a write path of a semiconductor memory apparatus according to one embodiment.

Referring to FIG. 2, the semiconductor memory apparatus 100 according to the embodiment includes a data output signal transmitter 200, a repeater 300, a write driver 350, and a cell array 400.

The data output signal transmitter 200 is configured to receive a data signal and a data mask signal from outside, determine whether the data signal is masked or not, and transmit a data output signal to the repeater 300 through a global data line GDL. According to an example, the data output signal transmitter 200 outputs the data signal if the determination result is that the data signal is not masked, e.g., the data mask signal is not enabled. In the semiconductor memory apparatus 100 according to the embodiment, since the data output signal transmitter 200 determines whether the data signal is masked or not, the data mask function may be performed without a global data mask line GDML for transmitting the data mask signal in the known semiconductor memory apparatus. Accordingly, the net die per wafer, i.e., the number of the semiconductor memory apparatus 100 per wafer may increase. The data output signal transmitter 200 will be described in detail with reference to FIG. 3.

The repeater 300 is configured to amplify the data output signal transmitted from the data output signal transmitter 200 and then transmit the amplified signal to the write driver 350 through the global data line GDL.

The write driver 350 is configured to input the data output signal into a local data line LDL of the cell array 400, and write data corresponding to the data output signal in the cell array 400 in response to a write driver strobe signal WDS. According to an example, even when the write driver strobe signal WDS is delayed a predetermined time by a delay unit (not illustrated) and the data output signal is then inputted to the write driver 350, the write driver 350 is enabled.

The data output signal transmitter 200 of the semiconductor memory apparatus 100 according to the embodiment will be described in more detail with reference to FIG. 3.

Figure 3:
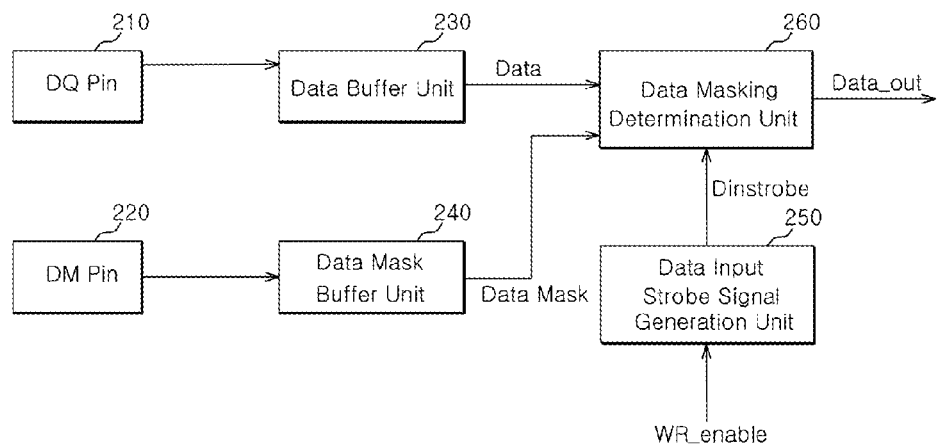
FIG. 3 is a block diagram illustrating a data output signal transmitter of the semiconductor memory apparatus according to the embodiment.
Figure 4:
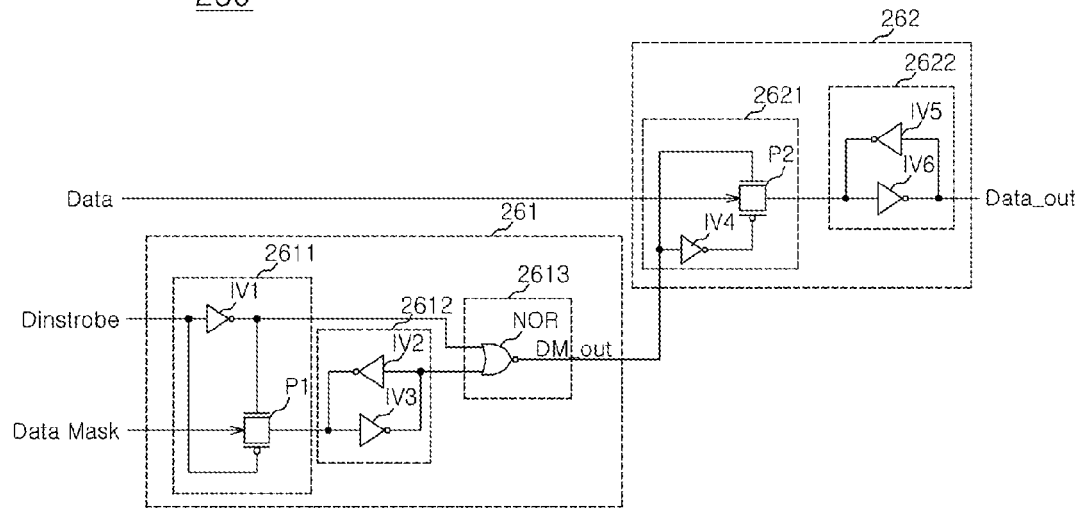
FIG. 4 is a circuit diagram illustrating a data masking determination unit of the semiconductor memory apparatus according to the embodiment.

FIG. 3 is a block diagram illustrating the data output signal transmitter of the semiconductor memory apparatus according to the embodiment. FIG. 4 is a circuit diagram illustrating a data masking determination unit of the semiconductor memory apparatus according to the embodiment.

Referring to FIG. 3, the data output signal transmitter 200 of the semiconductor memory apparatus 100 according to the embodiment includes a data pin (hereinafter, referred to as 'DQ pin') 210, a data mask pin (hereinafter, referred to as 'DM pin') 220, a data buffer unit 230, a data mask buffer unit 240, a data input strobe signal generation unit 250, and a data masking determination unit 260.

The DQ pin 210 is configured to receive a data signal inputted from outside.

The DM pin 220 is configured to receive a data mask signal inputted from outside.

The data buffer unit 230 is configured to receive the data signal inputted through the DQ pin 210, buffer the received data signal, and output the buffered data signal as an internal data signal Data.

The data mask buffer unit 240 is configured to receive the data mask signal inputted through the DM pin 220, buffer the received data mask signal, and output the buffered signal as an internal data mask signal Data Mask.

The data input strobe signal generation unit 250 is configured to generate a data input strobe signal Dinstrobe in response to a write enable signal WR_enable. That is, when the write enable signal WR_enable is at a high level, the data input strobe signal Dinstrobe becomes a high level, and when the write enable signal WR_enable is at a low level, the data input strobe signal Dinstrobe becomes a low level. At this time, according to an example, a write driver strobe signal WDS is also generated in synchronization with the write enable signal WR_enable. The activation time of the write driver strobe signal WDS is delayed in comparison with that of the data input strobe signal Dinstrobe.

The data masking determination unit 260 is configured to receive the data signal Data inputted from the data buffer unit 230, the data mask signal Data Mask inputted from the data mask buffer unit 240, and the data input strobe signal Dinstrobe inputted from the data input strobe signal generation unit 250, determine whether the data signal Data is masked or not, e.g., whether the data mask signal Data Mask is enabled or not, and output a data output signal Data_out to the repeater 300 according to the determination result. Referring to FIG. 4, the data masking determination unit 260 includes a data mask signal output section 261 and a data signal output section 262.

The data mask signal output section 261 is configured to output a data mask output signal DM_out in response to the data input strobe signal Dinstrobe, and includes a data mask signal output controller 2611, a first latch 2611, and an operation section 2613.

The data mask signal output controller 2611 is configured to control whether or not to output the data mask signal Data Mask. The data mask signal output controller 2611 includes a first inverter IV1 and a first pass gate P1. The first inverter IV1 is configured to invert the data input strobe signal Dinstrobe inputted from the data input strobe signal generation unit 250, and the first pass gate P1 is configured to control the output of the data mask signal Data Mask according to the input level of the data input strobe signal Dinstrobe. The data mask signal output controller 2611 is configured to output the data mask signal Data Mask when the data input strobe signal Dinstrobe is at a low level.

The first latch 2612 is configured to latch the data mask signal Data Mask which is outputted when the first pass gate P1 is turned on.

The operation section 2613 is configured to receive the data input strobe signal Dinstrobe inverted by the first inverter IV1 of the data mask signal output controller 2611 and the data mask signal Data Mask latched by the first latch 2612, and perform a NOR operation on the received signals to output the data mask output signal DM_out. The operation section 2613 includes a NOR gate NOR for performing a NOR operation.

The data signal output section 262 is configured to output the data output signal Data_out in response to the data mask output signal DM_out outputted from the data mask signal output section 261, and includes a data signal output controller 2621 and a second latch 2622.

The data signal output controller 2621 is configured to control the output of the data signal Data according to the level of the data mask output signal DM_out outputted from the data mask signal output section 261. That is, when the level of the data mask output signal DM_out is a low level, the data signal Data is masked so as not to be transmitted to the repeater 300, and when the level of the data mask output signal DM_out is a high level, the data signal Data is transmitted to the repeater 300 through the global data line GDL. The data signal output controller 2621 includes a fourth inverter IV4 configured to invert the level of the data mask output signal DM_out and a second pass gate P2 configured to output the data signal Data according to the level of the data mask output signal DM_out.

The second latch 2622 is configured to latch the data signal Data which is outputted when the second pass gate P2 is turned on, and then transmit the data output signal Data_out to the repeater 300.

Now, the operation process of the data masking determination unit 260 will be described. When the write enable signal WR_enable is activated, the data input strobe signal Dinstrobe is activated. When the activated data input strobe signal Dinstrobe is at a high level, the data input strobe signal Dinstrobe is inverted to a low level by the first inverter IV1. The inverted data input strobe signal Dinstrobe is inputted to the first pass gate P1, and the first pass gate P1 is turned off and dose not output the data mask signal Data Mask. When the data mask signal Data Mask is not outputted, the operation result by the operation section 2613 becomes a high level. Accordingly, the second pass gate P2 is turned on to output the data signal Data to the second latch 2622. The data output signal Data_out outputted to the second latch 2622 is latched by the second latch 2622 and then transmitted to the repeater 300.

Meanwhile, when the data input strobe signal Dinstrobe is at a low level, the data input strobe signal Dinstrobe is inverted to a high level by the first inverter IV1. Accordingly, the first pass gate P1 is turned on to output the data mask signal Data Mask. The data mask signal Data Mask outputted in such a manner is latched by the first latch 2612, and the operation section 2613 performs a NOR operation on the latched data mask signal Data Mask and the data input strobe signal Dinstrobe of which the level has been inverted. At this time, the data mask output signal DM_out has a low level, regardless of the level of the data mask signal Data Mask. That is because the level of the data input strobe signal Dinstrobe was inverted to a high level by the first inverter IV1. As such, when the data mask output signal DM_out is outputted, the second pass gate P2 is turned off to mask the data signal Data. That is, the data signal Data is not transmitted to the repeater 300.

In the known semiconductor memory apparatus, the data signal Data and the data mask signal Data Mask are received through the global data line GDL and the global data mask line GDML, respectively, and the write driver 350 determines whether data is masked or not. However, in the semiconductor memory apparatus 100 according to the embodiment, whether the data signal Data is masked or not is determined by the data output signal transmitter 200. Therefore, the data mask function may be performed without the data mask line GDML for transmitting the data mask signal to the repeater 30 and the write driver 40 in the known semiconductor memory apparatus. Accordingly, the net die of the semiconductor memory apparatus may increase.

Furthermore, in the semiconductor memory apparatus according to the embodiment, the repeater 300 as well as the data output signal transmitter 200 may perform a function of determining whether a data signal is masked or not. This will be described with reference to FIGS. 5 and 6.

Figure 5:
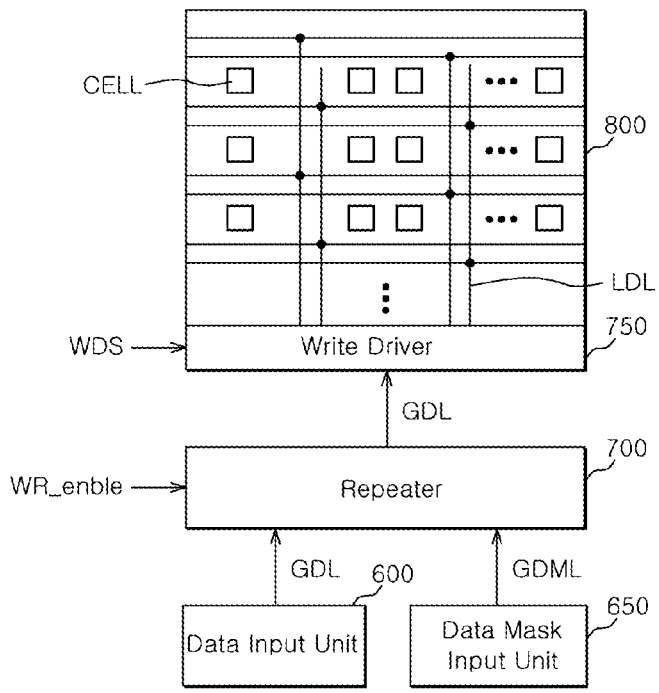
FIG. 5 is a block diagram illustrating a write path of a semiconductor memory apparatus according to another embodiment.
Figure 6:
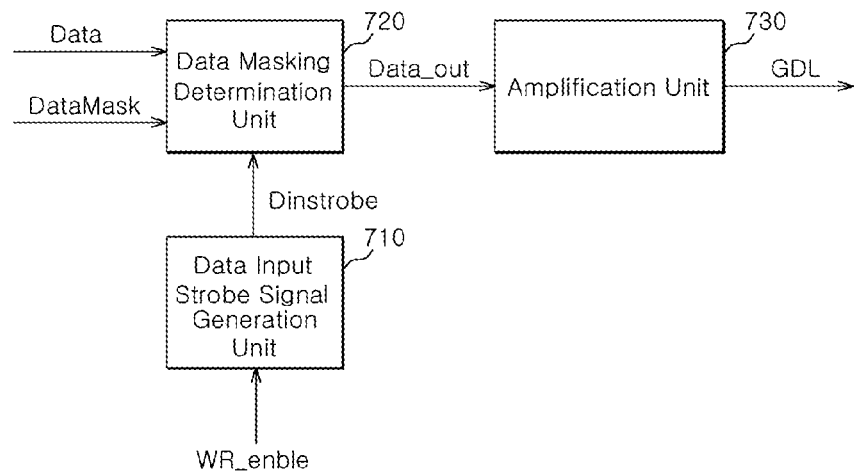
FIG. 6 is a block diagram illustrating a repeater of the semiconductor memory apparatus according to the embodiment.

FIG. 5 is a block diagram illustrating a write path of a semiconductor memory apparatus according to another embodiment. FIG. 6 is a block diagram illustrating a repeater of the semiconductor memory apparatus according to the embodiment.

Referring to FIG. 5, the semiconductor memory apparatus 500 according to the embodiment includes a data input unit 600, a data mask input unit 650, a repeater 700, a write driver 750, and a cell array 800.

The data input unit 600 is configured to transmit a data signal inputted from outside to the repeater 700 through a global data line GDL.

The data mask input unit 650 is configured to transmit a data mask signal inputted from outside to the repeater 700 through a global data mask line GDML.

The repeater 700 is configured to receive the data signal Data outputted from the data input unit 600 and the data mask signal Data Mask outputted from the data mask input unit 650 through the global data line GDL and the global data mask line GDML, respectively, determine whether the data signal is to be masked or not, and then output a data output signal to the write driver 750 through the global data line GDL. As such, in the semiconductor memory apparatus 500 according to the embodiment, the repeater 700 determines whether the data signal is masked or not. Therefore, since the global data mask line GDML for transmitting the data mask signal Data Mask to the write driver 750 may be removed, the net die of the semiconductor memory apparatus may increase.

Referring to FIG. 6, the repeater 700 includes a data input strobe signal generation unit 710, a data masking determination unit 720, and an amplification unit 730.

As described above with reference to FIG. 3, the data input strobe signal generation unit 710 is configured to generate a data input strobe signal Dinstrobe in response to a write enable signal WR_enable.

The data masking determination unit 720 is configured to receive the data signal Data outputted from the data input unit 600, the data mask signal Data Mask inputted from the data mask input unit 650, and the data input strobe signal Dinstrobe generated by the data input strobe signal generation unit 710, determines whether the data signal Data is masked or not, and output a data output signal Data_out. As described above with reference to FIG. 4, the data masking determination unit 720 includes a data mask signal output section and a data signal output section to determine whether the data signal Data is masked or not.

The amplification unit 730 is configured to amplify the data output signal Data_out outputted from the data masking determination unit 720, input the amplified signal to the global data line GDL, and transmit the signal to the write driver 750.

The write driver 750 is configured to input the data output signal Data_out to a local data line LDL of the cell array 800 corresponding to the data output signal Data_out transmitted from the repeater 600 according to the write driver strobe signal WDS, and write the data in the corresponding cell.

In the known semiconductor memory apparatus, the data signal Data and the data mask signal Data Mask are received through the global data line GDL and the global data mask line GDML, respectively, and whether data is masked or not is determined by the writer driver. However, in the semiconductor memory apparatus 500 according to the embodiment, the repeater 700 determines whether the data signal Data is masked or not. Therefore, since the global data mask line GDML for transmitting the data mask signal Data Mask to the write driver 750 may be removed, the net die of the semiconductor memory apparatus may increase.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a data output signal transmitter configured to receive a data signal and a data mask signal and transmit a data output signal through a global data line, wherein the data output signal is transmitted if the data signal is not masked; and
   a write driver configured to receive the data output signal through the global data line and input the received data output signal to a local data line,
   wherein the data output signal transmitter comprises:
      a data input strobe signal generation unit configured to be enabled by a write enable signal and generate a data input strobe signal;
      a data buffer unit configured to receive the data signal and buffer the received data signal;
      a data mask buffer unit configured to receive the data mask signal and buffer the received data mask signal; and
      a data masking determination unit configured to receive the data input strobe signal, the data signal and the data mask signal, and determine whether the data signal is masked or not.

2. The semiconductor memory apparatus according to claim 1, wherein the data masking determination unit comprises:

a data mask signal output section configured to output a data mask output signal in response to the data input strobe signal; and a data signal output section configured to output the data output signal in response to the data mask output signal.

3. The semiconductor memory apparatus according to claim 2, wherein the data mask signal output section comprises:

a data mask signal output controller configured to receive the data input strobe signal and control an output of the data mask signal;

a latch configured to latch the data mask signal outputted from the mask signal output controller; and an operation section configured to perform a NOR operation on the data input strobe signal and the data mask signal latched by the latch.

4. The semiconductor memory apparatus according to claim 3, wherein the data mask signal output controller comprises:

an inverter configured to invert the level of the data input strobe signal; and a pass gate configured to control whether or not to output the data mask signal in response to the data input strobe signal.

5. The semiconductor memory apparatus according to claim 2, wherein the data signal output section comprises:

a data signal output controller configured to control an output of the data signal in response to the data mask output signal outputted from the data mask signal output section; and a latch configured to latch the data signal outputted from the data signal output controller.

6. The semiconductor memory apparatus according to claim 5, wherein the data signal output controller comprises:

an inverter configured to invert a level of the data mask output signal; and a pass gate configured to control whether or not to output the data mask signal in response to the data mask output signal.

* * * * *